United States Patent [19]

Halliwell et al.

[11] Patent Number: 4,681,774
[45] Date of Patent: Jul. 21, 1987

[54] LASER INDUCED SELECTIVE ELECTROLESS PLATING

[76] Inventors: Michael J. Halliwell, 4435 Willow Mist Dr., Dayton, Ohio 45424; Joseph Zahavi, c/o Technion Research & Development Foundation, Ltd., Israel Institute of Metals, Haifa, Technion City, Israel

[21] Appl. No.: 819,558

[22] Filed: Jan. 17, 1986

[51] Int. Cl.⁴ .............................................. C23C 18/28
[52] U.S. Cl. ...................................... 427/53.1; 427/98; 427/306; 427/443.1; 427/434.2
[58] Field of Search ............. 427/53.1, 98, 306, 443.1, 427/434.2

[56] References Cited

U.S. PATENT DOCUMENTS

| | | | |
|---|---|---|---|
| 3,530,053 | 9/1970 | Scott et al. | 204/157.1 |
| 3,935,117 | 1/1976 | Suzuki et al. | 252/79.1 |
| 3,954,570 | 5/1976 | Shirk | 427/282 |
| 3,993,802 | 11/1976 | Polichette et al. | 427/98 |
| 4,121,007 | 10/1978 | Kobayashi | 427/96 |
| 4,239,789 | 12/1980 | Blum et al. | 427/53.1 |
| 4,239,813 | 12/1980 | Murakami et al. | 427/98 |
| 4,243,746 | 1/1981 | Ueda | 427/53.1 |
| 4,349,583 | 9/1982 | Kulynych et al. | 427/53.1 |
| 4,388,517 | 6/1983 | Schultz | 427/53.1 |
| 4,413,020 | 11/1983 | McKee | 427/53.1 |
| 4,615,907 | 10/1986 | Boeke | 427/53.1 |

*Primary Examiner*—John D. Smith
*Attorney, Agent, or Firm*—Charles E. Bricker; Donald J. Singer

[57] ABSTRACT

A method for maskless deposition of metals onto a workpiece by applying a sensitizing solution to a workpiece, directing a laser beam onto the sensitized workpiece surface to flash evaporate sensitizer from the workpiece in areas which are not to be plated, moving the workpiece or beam to describe a pattern, and thereafter contacting the thus-patterned sensitized workpiece with an electroless plating solution to deposit a layer of metal in those areas from which the sensitizer is not flashed off.

20 Claims, 6 Drawing Figures

LASER INDUCED SELECTIVE ELECTROLESS PLATING

RIGHTS OF THE GOVERNMENT

The invention described herein may be manufactured and used by or for the Government of the United States for all governmental purposes without the payment of any royalty.

BACKGROUND OF THE INVENTION

This invention relates to a method for metal plating, particularly, a method for selective plating from electroless plating solutions.

While it is possible to produce high resolution patterns by electroless deposition techniques wherein masking is employed to delineate the pattern, such plating processes require multiple steps. It is necessary to employ a photoresist to mask the surface, to selectively expose the photoresist mask, to plate the surface, and finally, to strip the mask. This process is a multistep process.

It is known to expose a substrate immersed in an electroless plating solution to a high intensity light source to enhance the plating rate. While this technique increases the plating rate, it is not well suited for preferentially plating patterns since there will be a mixing of the activated solution with the nonactivated solution, thus reducing the resolution of any plated pattern.

It is also known to coat a surface to be plated with a sensitizing solution. The coated surface is exposed to light to form a catalytic layer capable of catalyzing the deposition of metal thereon from an electroless metal deposition solution.

We have discovered a novel method for selective maskless electroless plating.

Accordingly, it is an object of the present invention to provide a novel method for selective maskless electroless plating.

Other objects and advantages of the present invention will be apparent to those skilled in the art from a reading of the following description of the invention.

SUMMARY OF THE INVENTION

In accordance with the present invention there is provided a method for selectively plating a metal onto a workpiece which comprises, in combination, the steps of applying a sensitizing solution to the workpiece, directing a laser beam onto the workpiece in the area which is not to be plated, and thereafter contacting the workpiece with an electroless plating solution to achieve plating thereon.

DESCRIPTION OF THE INVENTION

Figure 1:
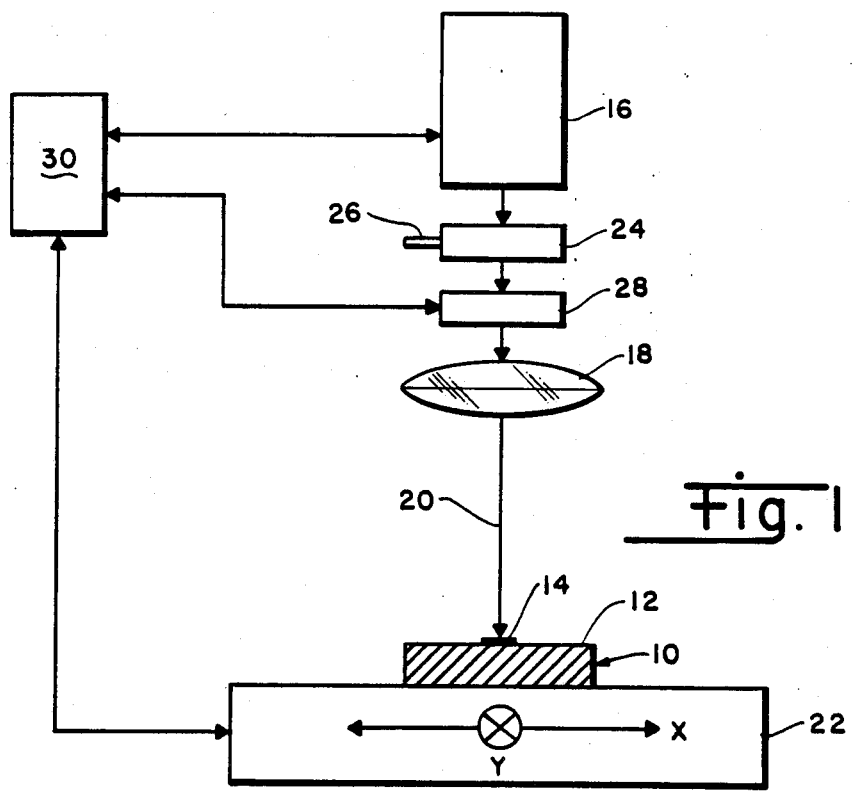
FIG. 1 is a schematic showing a laser source directed through a lens onto a workpiece located on an X-Y table.

The practice of electroless plating in accordance with this invention will be described with reference to the drawings. There is shown in FIG. 1 a workpiece 10 having a surface 12 whereon plating is desired. The surface 12 has a finite layer of sensitizer 14 applied thereon. The sensitizer or activator is a conventional one, such as a $PdCl_2$—$SnCl_2$—HCl solution, or the like.

A laser energy source 16 is focused by lens system 18 to concentrate the energy and form a beam 20. A pattern can be generated on surface 12 by moving the beam 20 on the workpiece 10 using an X-Y table 22. A filter holder 24 for holding one or more absorbing filters 26 may be interposed in the energy path between source 16 and the lens system 18.

The beam 20 emitted from the laser source 16 may be modulated by a modulator 28 which may, if desired, be placed between the source 16 and the lens system 18. The modulator 28 may be a mechanical light chopper or an optical or electrical modulator.

The X-Y table 22, the laser source 16 and the modulator 28 may be controlled by a controller 30.

Figure 2:
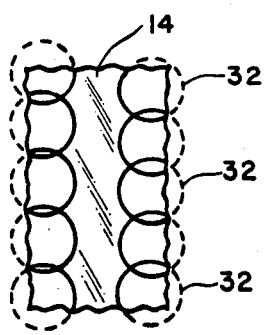
FIG. 2 is a portion of a workpiece surface showing overlapping patterns of laser pulses.

In practice, the workpiece 10 is coated with a layer 14 of the sensitizing solution and placed on X-Y table 22. The laser beam 20 is focused upon surface 12 to obtain a spot diameter of about 0.25 to 2 mm, preferably about 0.5 to 0.75 mm. The X-Y table is set up to step in the X and/or Y direction with about 10 to 95 percent overlap at a lineal rate of about 15-25 cm/min. Alternatively, the X-Y table can be set up to move in continuous fashion. FIG. 2 illustrates the pattern of overlapping spots 32 obtained by stepping the X-Y table to provide about 15% overlap. The sensitizer is flash evaporated from the surface 12 of workpiece 10 by the laser beam energy. After the desired pattern has been described on the surface of workpiece 10, the workpiece is immersed in an electroless plating solution. Metal will plate out from the plating solution onto those portions of the workpiece which have the sensitizer thereon. These portions of the workpiece from which the sensitizer was removed by the laser energy will not be plated.

Alternatively, instead of moving the workpiece in order to describe a pattern thereon, the laser beam 20 can be moved, such as by mounting the energy source/lens system assembly on an X-Y traverse assembly, or by using a system of movable mirrors, as is known in the art.

The laser energy source 16 may be any known laser source which provides light in the range of ultraviolet to far infrared, preferably in the near infrared, and has an intensity sufficient to provide a beam 22 with an intensity in the approximate range of 0.05 to 5.0 joule/$cm^2$, preferably about 0.1 to 2.0 joule/$cm^2$. Thus, the laser energy source 16 may be an argon laser, tuned to about 0.5 $\mu$m, or preferably, a pulsed radiation beam, typically a Q-switched neodymium yttrium aluminum garnet (Nd:YAG) laser, is used. As used herein, the terms "pulsed radiation" and "pulsed laser" refer to radiant energy sources that produce discrete energy pulses as a function of time. These terms are not descriptive of, or limiting to, the method for achieving such energy pulses. For example, "pulsed laser" includes capacitor-switched lasers, Q-switched lasers, and the like.

Laser energy density upon the workpiece can be easily controlled and changed by inserting absorbing optical filters 26 between the source 16 and the lens system 18. Such filters are available commercially from a variety of sources.

The workpiece 10 may be any material known in the art which is normally solid at room temperature and which is capable of being plated upon using an electroless plating technique. The workpiece may, for example, be a polymeric material. Examples of suitable polymeric materials include phenolics, epoxies, polyethylene, polypropylene, acrylics, methacrylates, styrenic polymers, acrylonitrile butadienestyrene, polyamides, polyimides, and the like. The workpiece may be a semiconductor material such as, for example, gallium arsenide, silicon, germanium, and the like. The workpiece may be a metal, such as nickel, or a glass.

Figure 3:
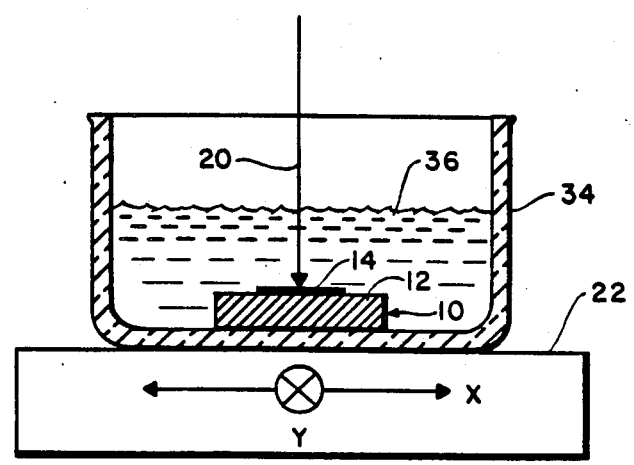
FIG. 3 is a schematic showing a workpiece located in a liquid filled container.

While the sensitizer can be removed from the workpiece as shown in FIG. 1, it may be desirable to place the sensitized workpiece 10 in a container 34, as shown in FIG. 3, holding distilled water 36 or other liquid media which is inert to the sensitizer and the workpiece, in order to prevent the sensitizer flash evaporated from the surface of workpiece 10 from contaminating the surrounding atmosphere. It may also be desirable to immerse the workpiece in a suitable fluid to take advantage of the increased resolution available using fluid immersion optic techniques.

Although the method of the present invention has been described with respect to plating onto a flat surface, it is not limited thereto; virtually any shape that can be plated by electroless plating can be employed in the present invention. The method of this invention is highly controllable, it does not require expensive masking steps to produce selective plating. The method of this invention is of particular interest for producing experimental flexible circuits using a substrate such as a polyimide.

Figure 4:
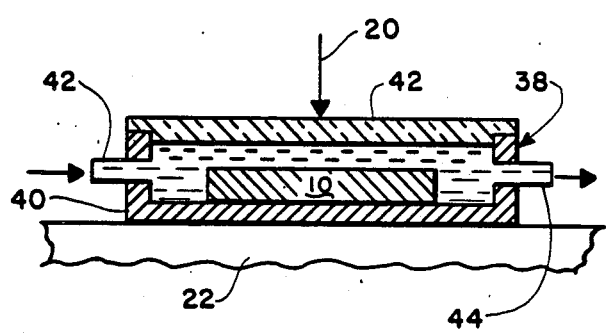
FIG. 4 illustrates an alternative plating vessel.

FIG. 4 illustrates an alternative vessel 38 for electrolessly plating a workpiece 10. The vessel 38, shown positioned on an X-Y table 22 comprises a housing 40 having an cover 42 which is transparent to the laser beam 20, inlet means 42 for introducing solutions into vessel 38 and outlet means 44 for withdrawing solutions from vessel 38. In use, the workpiece 10 is positioned in the housing 40, the transparent cover 42 is attached or otherwise fitted thereto and the vessel 38 is positioned on the X-Y table 22. A sensitizing solution of the type described previously is introduced into the closed vessel 38 through inlet means 42 to coat the workpiece 10 with a layer of sensitizer and then withdrawn therefrom through outlet means 44.

Distilled water or another suitable liquid may then be introduced into the vessel 38 through inlet means 42 to flush excess sensitizing solution from vessel 38 and to capture any sensitizer flashed off the workpiece 10 by the laser beam 20. The sensitized workpiece is then exposed to laser beam energy and the X-Y table 22 is stepped as hereinbefore described. After the desired pattern has been described upon the workpiece, the distilled water is withdrawn from the vessel 38 through the outlet means 44. An electroless plating solution is then introduced into vessel 38 through inlet means 42 and maintained in contact with the patterned, sensitized workpiece 10 for a time sufficient to obtain a desired plating deposit.

Figure 5:
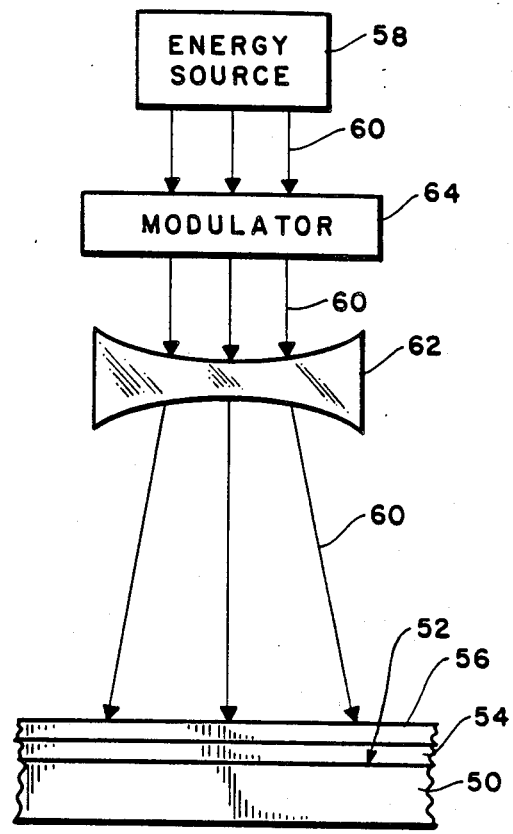
FIG. 5 is a schematic showing a laser source directed onto a workpiece having a mask.

It is also within the scope of the present invention to employ a mask to define the pattern to be plated. The mask may be a photoresist-type mask or a separate film-type mask. There is shown in FIG. 5 a workpiece 50 having a surface 52 whereon plating is desired. The surface 52 has a finite layer 54 of sensitizer applied thereto. A film-type mask 56 is disposed in intimate contact with the sensitizer layer 54. A laser source 58 is positioned so that its beam 60 is directed through a lens system 62, then through the mask 62 onto the sensitizer layer 54. The beam 60 may be modulated by a modulator 64 which may be placed between the source 58 and the lens system 62. Any portion of the beam 60 passing through the mask 56 flash evaporates sensitizer from the workpiece surface 52, leaving a non-sensitized area.

Figure 6:
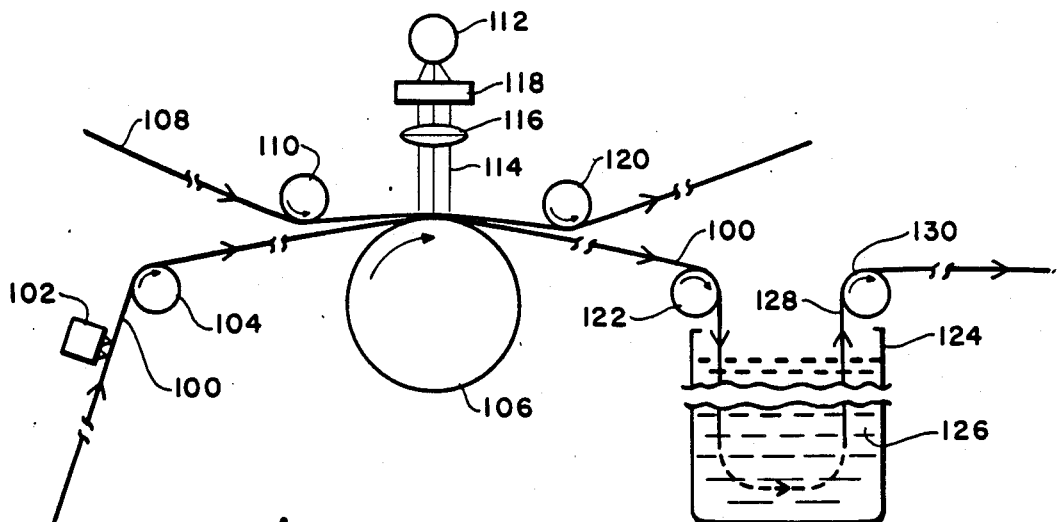
FIG. 6 is a schematic showing a continuous electroless plating process in accordance with the invention.

The process of this invention can be carried out in continuous fashion, as shown in FIG. 6. A flexible substrate 100, such as a polyimide film, is taken from a source, not shown, and passed in contact with a sensitizer applicator means 102 where a film of sensitizer is applied to the film. The thus-sensitized film is passed over an idler roller 104, thence over exposure roller 106. At the same time, a flexible photomask 108 is taken from a source, not shown, passed over an idler 110, thence over exposure roller 106 in contact with the sensitized film 100. A laser source 112 is so positioned that it directs a beam 114 through the mask 108 onto the sensitized film 100. The beam 114 may be focused by the lens system 116 and may be modulated by a modulator 118. The portion of the beam 114 which passes through the mask 108 flash evaporates sensitizer from the sensitized film 100 as described previously. The photomask is then separated from the now pattern-sensitized film 100, passed over idler roller 120 and taken up by take-up means, not shown. The photomask 108 may be in the form of a continuous loop so that it runs continuously through the apparatus.

Following separation from the photomask 108, the pattern-sensitized film 100 is passed over an idler roller 122 and into a plating tank 124 which contains an electroless plating solution 126. The film is maintained in contact with the electroless plating solution 126 for a time sufficient to achieve a desired level of plating. The plated film, now designated as item 128 is removed from contact with plating solution 126 and passed over idler roller 130 for further processing, such as washing, drying, cutting into individual circuit strips, etc.

Various modifications and alterations may be made in the present invention without departing from the spirit thereof or the scope of the appended claims.

We claim:
1. A method for selectively plating a metal onto a workpiece which consists essentially of the steps of
  (a) applying a sensitizing solution to said workpiece, thereby providing a sensitized workpiece,
  (b) describing a pattern on said workpiece by flash evaporating sensitizer from said workpiece by directing a laser beam onto the thus-sensitized workpiece in an area which is not to receive said metal plated thereon, and
  (c) contacting said workpiece with an electroless plating solution to achieve plating in areas wherein said sensitizer remains.
2. The method of claim 1 wherein said sensitizer is a $PdCl_2$—$SnCl_2$—$HCl$ solution.
3. The method of claim 1 wherein said laser has an intensity in the range of about 0.05 to 5.0 joule/cm$^2$.
4. The method of claim 3 wherein said laser is a Q-switched Nd:YAG laser.
5. The method of claim 1 wherein said beam directing step (b) is carried out with said sensitized workpiece immersed in a liquid media.

6. The method of claim 1 wherein said workpiece is a flexible, polymeric film.

7. The method of claim 7 wherein said film is a polyimide.

8. The method of claim 1 wherein said pattern is described by a photomask.

9. The method of claim 1 wherein said beam is focused and wherein said pattern is described by moving at least one of said workpiece and said beam relative to the other.

10. A method for selectively plating a metal onto a workpiece which consists essentially of the steps of
   (a) mounting a workpiece in a plating vessel comprising a housing, a cover which is transparent to laser radiation, inlet means for introducing a fluid into said vessel and outlet means for withdrawing a fluid from said vessel;
   (b) introducing a sensitizing solution into said vessel while withdrawing therefrom any residual fluid previously therein, to thereby coat said workpiece with a layer of said sensitizer solution;
   (c) introducing an inert liquid media into said vessel while withdrawing therefrom said sensitizer solution, thereby flushing excess sensitizer solution from said vessel;
   (d) describing a pattern on said workpiece by flash evaporating sensitizer from said workpiece by directing a laser beam through said transparent cover and said inert liquid and onto the thus-sensitized workpiece in an area which is not to receive said metal plated thereon; and
   (e) introducing an electroless plating solution into said vessel while withdrawing therefrom said inert liquid and maintaining said plating solution in contact with the thus-plated sensitized workpiece for a time sufficient to obtain a desired plating deposit.

11. The method of claim 10 wherein said sensitizer solution is a $PdCl_2$—$SnCl_2$—HCl solution.

12. The method of claim 10 wherein said inert liquid is distilled water.

13. The method of claim 10 wherein said laser has an intensity in the range of about 0.05 to 5.0 joule/cm$^2$.

14. The method of claim 13 wherein said laser is a Q-switched Nd:YAG laser.

15. The method of claim 8 wherein said workpiece is a flexible, polymeric film.

16. The method of claim 13 wherein said film is a polyimide.

17. A method for continuously plating a metal onto a workpiece which consists essentially of the steps of coating a linearly moving flexible workpiece with a sensitizer, positioning a linearly moving photomask in contact with the thus-sensitized workpiece, moving said sensitized workpiece and said photomask through a laser beam positioned so that the said beam is directed onto said mask and through selected portions thereof onto said workpiece, whereby the portion of light passing through said selected portions flash evaporates said sensitizer from said sensitized workpiece, separating said photomask from the resulting pattern-sensitized workpiece, and contacting said pattern-sensitized workpiece with an electroless plating solution for a time sufficient to achieve a desired level of plating thereon.

18. The method of claim 17 wherein said sensitizer is a $PdCl_2SnCl_2$—Hcl solution.

19. The method of claim 17 wherein said beam has an intensity of 0.05 to 5.0 joule/cm$^2$.

20. The method of claim 17 wherein said workpiece is a polyimide film.

* * * * *